United States Patent
Ano et al.

(10) Patent No.: US 10,663,137 B2
(45) Date of Patent: May 26, 2020

(54) LIGHT SOURCE UNIT FOR VEHICLE HEADLIGHT AND VEHICLE HEADLIGHT

(71) Applicant: STANLEY ELECTRIC CO., LTD., Tokyo (JP)

(72) Inventors: Koichiro Ano, Sagamihara (JP); Nobuo Kato, Hadano (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/224,267

(22) Filed: Dec. 18, 2018

(65) Prior Publication Data

US 2019/0195460 A1    Jun. 27, 2019

(30) Foreign Application Priority Data

Dec. 21, 2017    (JP) .................. 2017-244973

(51) Int. Cl.
*F21S 43/31*    (2018.01)
*F21S 43/14*    (2018.01)
(Continued)

(52) U.S. Cl.
CPC ............. *F21S 43/14* (2018.01); *F21S 41/143* (2018.01); *F21S 41/192* (2018.01); *F21S 41/194* (2018.01); *F21S 41/336* (2018.01); *F21S 43/195* (2018.01); *F21S 43/31* (2018.01); *F21V 31/005* (2013.01); *H05K 1/181* (2013.01); *F21S 45/47* (2018.01); *F21W 2103/10* (2018.01);
(Continued)

(58) Field of Classification Search
CPC ...................................................... F21S 43/14
See application file for complete search history.

(56) References Cited

U.S. PATENT DOCUMENTS

| | | | | |
|---|---|---|---|---|
| 4,825,344 A | * | 4/1989 | Ichihara | ................ F21S 41/334 362/518 |
| 2003/0227774 A1 | * | 12/2003 | Martin | ...................... F21V 7/09 362/240 |

(Continued)

FOREIGN PATENT DOCUMENTS

| | | |
|---|---|---|
| CN | 206176065 U | 5/2017 |
| EP | 1 371 901 A2 | 12/2003 |

(Continued)

OTHER PUBLICATIONS

The extended European Search Report for the related European Patent Application No. 18212537.7 dated Feb. 19, 2019.

*Primary Examiner* — Donald L Raleigh
(74) *Attorney, Agent, or Firm* — Kenealy Vaidya LLP

(57) ABSTRACT

A light source unit for a vehicle headlight includes a circuit board on which four light emitting devices are disposed at each of four directions with respect to a center thereof, and a reflector provided on the circuit board so as to surround the four light emitting devices, wherein the circuit board includes four side areas in which the four light emitting devices are disposed, one center area disposed at a center of the four side areas and four corner areas disposed at corner sections next to the four side areas, and the reflector includes eight first reflective surfaces provided to divide spaces between each of the side areas and the corner areas, and four second reflective surfaces provided to divide sides of each of side areas opposite to the center area.

12 Claims, 10 Drawing Sheets

(51) Int. Cl.
  *H05K 1/18* (2006.01)
  *F21V 31/00* (2006.01)
  *F21S 43/19* (2018.01)
  *F21S 41/19* (2018.01)
  *F21S 41/143* (2018.01)
  *F21S 41/33* (2018.01)
  *F21W 103/10* (2018.01)
  *F21S 45/47* (2018.01)
  *F21Y 105/12* (2016.01)
  *F21Y 115/10* (2016.01)

(52) U.S. Cl.
  CPC ....... *F21Y 2105/12* (2016.08); *F21Y 2115/10* (2016.08); *H05K 2201/10106* (2013.01); *H05K 2201/10287* (2013.01); *H05K 2201/10522* (2013.01)

(56) References Cited

U.S. PATENT DOCUMENTS

| | | | |
|---|---|---|---|
| 2005/0073846 A1* | 4/2005 | Takine | .............. H01L 33/64 |
| | | | 362/296.04 |
| 2013/0343076 A1* | 12/2013 | Nakada | .............. F21S 41/147 |
| | | | 362/516 |
| 2015/0325740 A1 | 11/2015 | Serita et al. | |
| 2018/0080624 A1 | 3/2018 | Wu et al. | |

FOREIGN PATENT DOCUMENTS

| | | |
|---|---|---|
| JP | 2012-38698 A | 2/2012 |
| JP | 2013-218972 A | 10/2013 |
| JP | 2015-60753 A | 3/2015 |
| JP | 5828714 B2 | 12/2015 |
| JP | 2016-195099 A | 11/2016 |
| WO | 2013/153938 A1 | 10/2013 |
| WO | 2017/188066 A1 | 11/2017 |

* cited by examiner

LIGHT SOURCE UNIT FOR VEHICLE HEADLIGHT AND VEHICLE HEADLIGHT

CROSS-REFERENCE TO RELATED APPLICATION

Priority is claimed on Japanese Patent Application No. 2017-244973, filed Dec. 21, 2017, the content of which is incorporated herein by reference.

BACKGROUND OF THE INVENTION

Field of the Invention

The present invention relates to a light source unit for a vehicle headlight and a vehicle headlight.

Description of Related Art

In recent years, in a vehicle headlight, as increase in luminance and reduction in costs of light emitting diodes (LEDs) has proceeded, employment of LEDs as a light source has gradually increased. An LED has an advantage of providing a long lifespan and the power consumption thereof is small.

For example, a light source unit in which a socket with a coupler, on which an LED is mounted, is detachably attached to an attachment hole formed in alighting body on a back surface side has been proposed (for example, see Japanese Unexamined Patent Application, First Publication No. 2016-195099 and Japanese Patent No. 5828714). Such a light source unit may be suitably used as an exchangeable (replaceable) light source such as a tail light for a vehicle or the like that emits red light.

SUMMARY OF THE INVENTION

Incidentally, regarding the above-mentioned light source unit in the related art, in "Regulation No. 128 Uniform provisions concerning the approval of light emitting diode (LED) light sources for use in approved lamp units on power-driven vehicles and their trailers" of the United Nations (UN) regulations (standards), it is difficult to efficiently satisfy the light distribution standards for red light sources (LR3A, LR3B).

Specifically, in the UN regulations, as shown in FIG. 13, four LEDs LED1 to LED4 are positioned on each of four sides in an area of 3 mm square (3 mm×3 mm) on a circuit board B, and a total of nine areas including four side areas B1 to B4 in which four LEDs LED1 to LED4 are located, one center area A disposed at a center inside the four side areas B1 to B4, and four corner areas C1 to C4 disposed at corner sections between neighboring side areas of the four side areas B1 to B4 are defined.

Regarding this, in order to satisfy the UN regulations, as shown in the following Table 1, in a total luminous flux of light emitted forward from the four LEDs LED1 to LED4, percentage of luminous fluxes emitted from each of the segments corresponding to the four side areas B1 to B4 need be set to 20% or more, percentage of luminous fluxes emitted from each of the segments corresponding to the one center area A and the four corner areas C1 to C4 need be set to 10% or less, and a percentage of a luminous flux for a total sum of all the areas needs to be set to 90% or more.

TABLE 1

| C1 | B1 | C4 |
|---|---|---|
| 10% or less | 20% or more | 10% or less |
| B2 | A | B4 |
| 20% or more | 10% or less | 20% or more |
| C4 | B3 | C3 |
| 10% or less | 20% or more | 10% or less |

In addition, as shown in the following Table 2, a percentage of the luminous flux at each of the corner areas C1 to C4 and the center area A are allowed more for mass-produced products compared to the standardized products.

TABLE 2

| Segment | Mass-produced | Standardized |
|---|---|---|
| A | ≤25% | ≤10% |
| B1 | ≥15% | ≥20% |
| B2 | | |
| B3 | | |
| B4 | | |
| C1 | — | ≤10% |
| C2 | — | |
| C3 | — | |
| C4 | — | |
| A+B+C | ≥90% | ≥90% |

In addition, in the UN regulations, as shown in FIG. 14, values [cd/1000 lm] of normalized luminous intensities for LR3A and LR3B at each measurement points need to satisfy a range of luminous intensity standards for standardized products (target luminous flux value: 80 lm±10%) and mass-produced products (target luminous flux value: 80 lm±20%). In addition, the range of a luminous intensity standard for mass-produced products is wider than that for standardized products.

For example, in a light source unit disclosed in Japanese Unexamined Patent Application, First Publication No. 2016-195099, a configuration in which a total of five LEDs are disposed in four side areas and one center area is provided. Accordingly, in such disposition of LEDs, since the percentage of the luminous flux emitted from the segment corresponding to the center area is increased, it is difficult to satisfy the above-mentioned light distribution standards.

In addition, in the light source unit disclosed in Japanese Unexamined Patent Application, First Publication No. 2016-195099, a configuration in which the LED disposed on the board is sealed by a sealing resin and a lens is disposed on thereof is provided. In the case of this configuration, since an optical path length in the sealing resin and the lens is lengthened, an extraction efficiency of light deteriorates due to attenuation of the light. In addition, there is also concern regarding falling out of the lens due to vibration, impact, or the like, during traveling of the vehicle. Further, since high molding accuracy and mounting accuracy are needed in the lens, costs are increased.

Meanwhile, in a light source unit disclosed in Japanese Patent No. 5828714, a configuration in which a plurality of LEDs are arranged in a row is provided. Accordingly, in such disposition of LEDs, a configuration that satisfies the above-mentioned light distribution standards is not provided.

In addition, in the light source unit disclosed in Japanese Patent No. 5828714, a configuration in which a reflective surface inclined toward an opening end of a wall section is formed inside a wall section that surrounds a plurality of LEDs disposed on a board is provided. In the case of this configuration, since light enters an area next to the area in which the LEDs are disposed, it is difficult to adjust a percentage of a luminous flux emitted from a segment corresponding to each of the above-mentioned areas.

An aspect of the present invention is directed to providing a light source unit for a vehicle headlight capable of increasing an extraction efficiency of light while satisfying light distribution standards, and a vehicle headlight including such light source unit for a vehicle headlight.

A light source unit for a vehicle headlight according to an aspect of the present invention includes a circuit board on which four light emitting devices are disposed at each of four directions with respect to a center thereof; and a reflector installed on the circuit board so as to surround the four light emitting devices, wherein the circuit board includes four side areas in which the four light emitting devices are disposed, one center area disposed at a center of the four side areas, and four corner areas disposed at corner sections next to the four side areas, and the reflector includes eight first reflective surfaces provided to divide spaces between each of the side areas and the corner areas, and four second reflective surfaces provided to divide sides of each of the side area opposite to the center area.

In the aspect of the present invention, the first reflective surface may include a vertical surface section vertically standing upward from a front surface of the circuit board, and an inclined surface section inclined from the vertical surface section toward an opening end of the reflector.

In the aspect of the present invention, the second reflective surface may include a vertical surface section vertically standing upward from a front surface of the circuit board, and an inclined surface section inclined from the vertical surface section toward an opening end of the reflector.

In the aspect of the present invention, the vertical surface section may have a height that substantially coincides with the light emitting device.

In the aspect of the present invention, the inclined surface section may have a curved surface shape protruding outward.

In the aspect of the present invention, the circuit board may include a plurality of wirings configured to linearly connect the four light emitting devices to each other, and among the plurality of wirings, one end sides of each of the wirings that are disposed in the center area and each of the light emitting devices that are disposed next to each of the light emitting devices electrically connected to other end sides of each of the wirings may be respectively electrically connected via bonding wires.

In the aspect of the present invention, a sealing resin may be provided inside the reflector.

In the aspect of the present invention, among a total luminous flux of light emitted forward from the four light emitting devices, a percentage of a luminous flux emitted from each of segments corresponding to the four side areas may be respectively 20% or more, and a percentage of a luminous flux emitted from each of segments corresponding to the one center area and the four corner areas may be respectively 10% or less.

A vehicle headlight according to another aspect of the present invention includes the light source unit for a vehicle headlight according to any one of the aspects.

In the aspect of the present invention, the light source unit for a vehicle headlight may be detachably attached to a lighting body.

According to the aspect of the present invention, it is possible to provide a light source unit for a vehicle headlight capable of increasing an extraction efficiency of light while satisfying light distribution standards, and a vehicle headlight including the light source unit for a vehicle headlight.

DETAILED DESCRIPTION OF THE INVENTION

Figure 1:
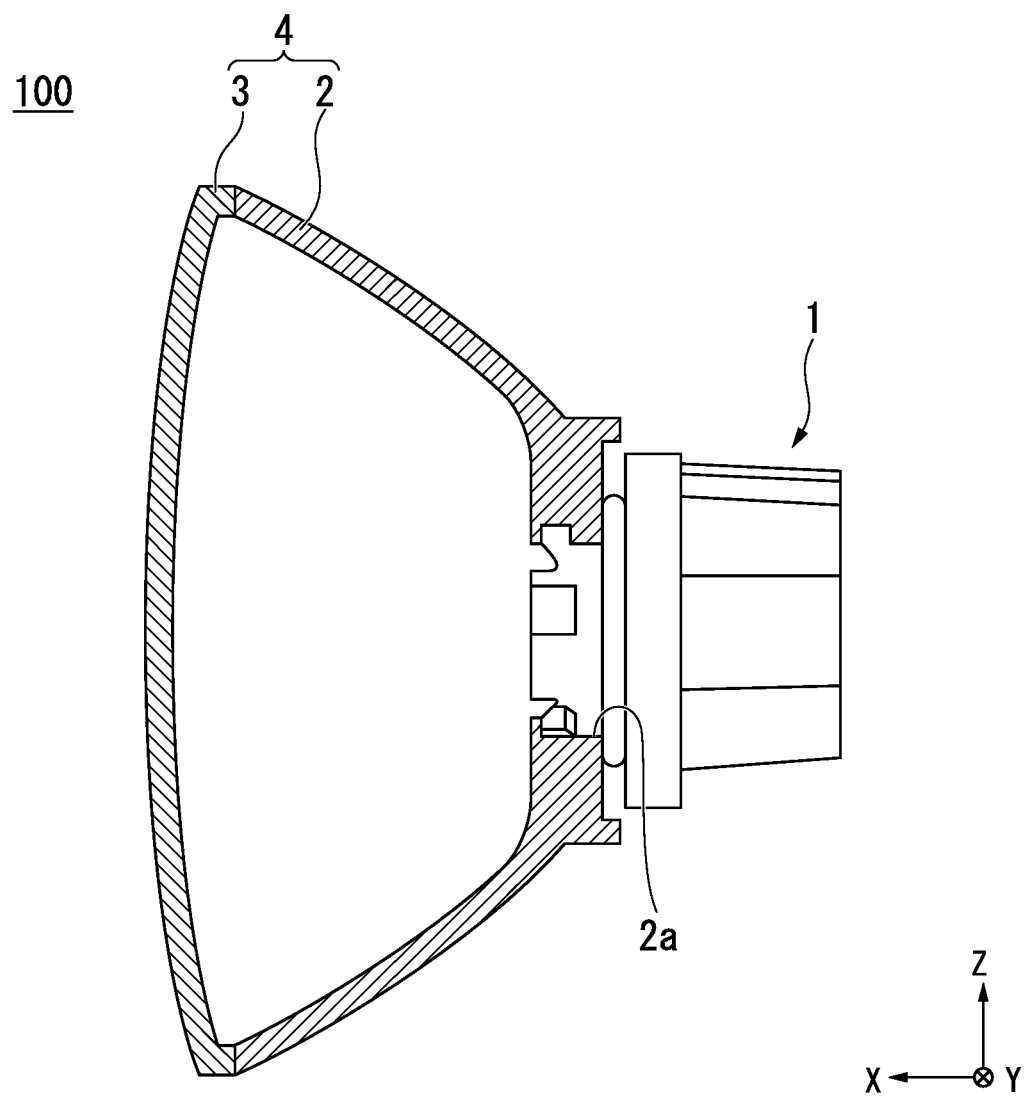
FIG. 1 is a cross-sectional view showing a configuration of a vehicle headlight including a light source unit for a vehicle headlight according to an embodiment of the present invention.

Hereinafter, an embodiment of the present invention will be described in detail with reference to the accompanying drawings.

Further, in the drawings used in the following description, in order to make respective components easier to see, the components may be shown with changed sizes of dimensions, and dimensional proportions or the like of respective components may not necessarily be the same as actual ones. In addition, materials or the like exemplified in the following description are examples, and the present invention is not necessarily limited thereto and appropriate modifications may be made without departing from the scope of the present invention.

As an embodiment of the present invention, for example, a vehicle headlight 100 including a light source unit for a vehicle headlight (hereinafter, referred to as a light source unit) 1 shown in FIG. 1 will be described. Further, FIG. 1 is a cross-sectional view showing a configuration of the vehicle headlight 100 including the light source unit 1.

In addition, an XYZ orthogonal coordinate system is established in the drawings as described below, an X-axis direction indicates a forward/rearward direction (a lengthwise direction) with respect to the light source unit 1 (the vehicle headlight 100), a Y-axis direction indicates a leftward/rightward direction (a widthwise direction) with respect to the light source unit 1 (the vehicle headlight 100), and a Z-axis direction indicates an upward/downward direction (a height direction) with respect to the light source unit 1 (the vehicle headlight 100).

The vehicle headlight 100 of the embodiment is a lighting tool in which the present invention is applied to, for example, tail lamps configured to emit red light at both of corner sections of a rear end side of a vehicle (not shown).

Further, in the following description, directions of forward, rearward, leftward, rightward, upward and downward in the following description are the same as directions viewing forward to the vehicle headlight 100 (the light source unit 1) (from a side to the rear of a vehicle) unless the context clearly indicates otherwise. Accordingly, directions when the vehicle is seen from the front (a side in front of the vehicle) are directions to which the directions of forward, rearward, leftward, rightward, upward and downward are reversed.

Specifically, as shown in FIG. 1, the vehicle headlight 100 has a configuration in which the light source unit 1 is disposed inside a lighting body 4 constituted by a housing 2, a front surface of which is open, and a transparent lens cover 3 configured to cover an opening of the housing 2.

The light source unit 1 is configured with a socket with a coupler on which an exchangeable LED lamp is mounted. The light source unit 1 is detachably attached to an attachment hole 2a formed in the housing 2 (the lighting body 4) on a back surface (a rear surface) so that a front surface side thereof can be disposed inside a lighting body 101.

Figure 2:
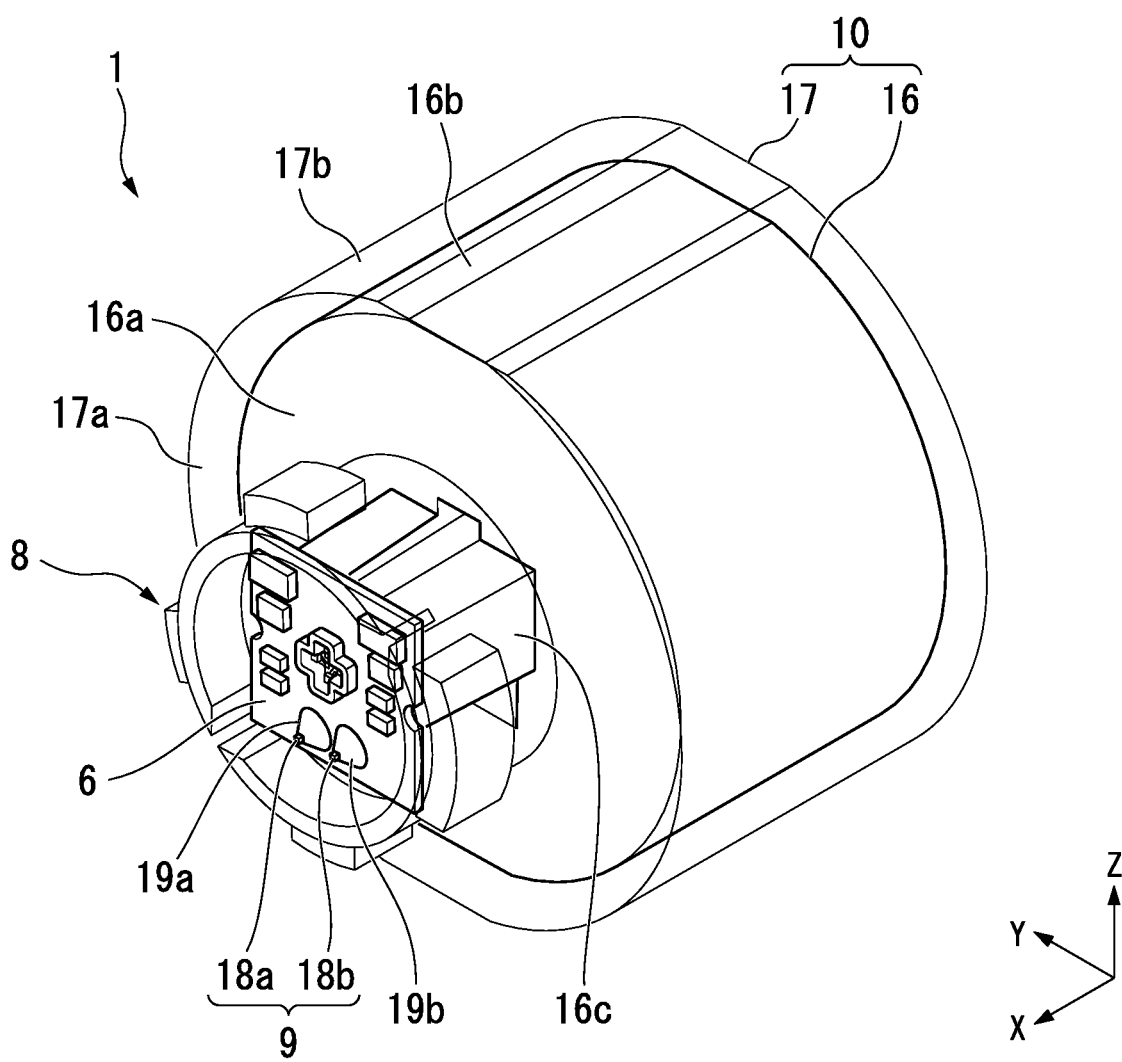
FIG. 2 is a transparent perspective view showing a configuration of the light source unit for a vehicle headlight shown in FIG. 1.
Figure 3:
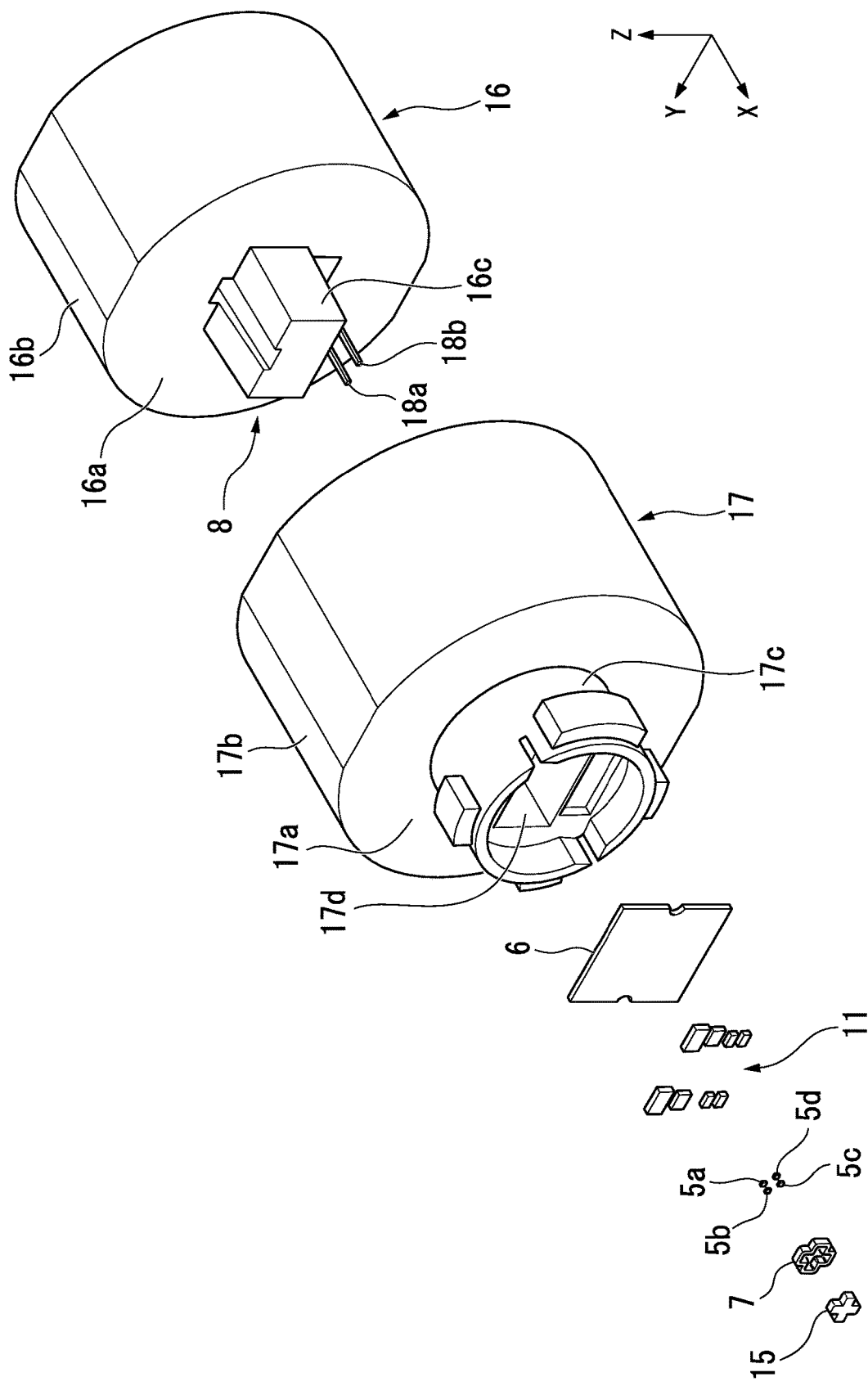
FIG. 3 is an exploded perspective view showing a configuration of the light source unit for a vehicle headlight shown in FIG. 1.
Figure 4:
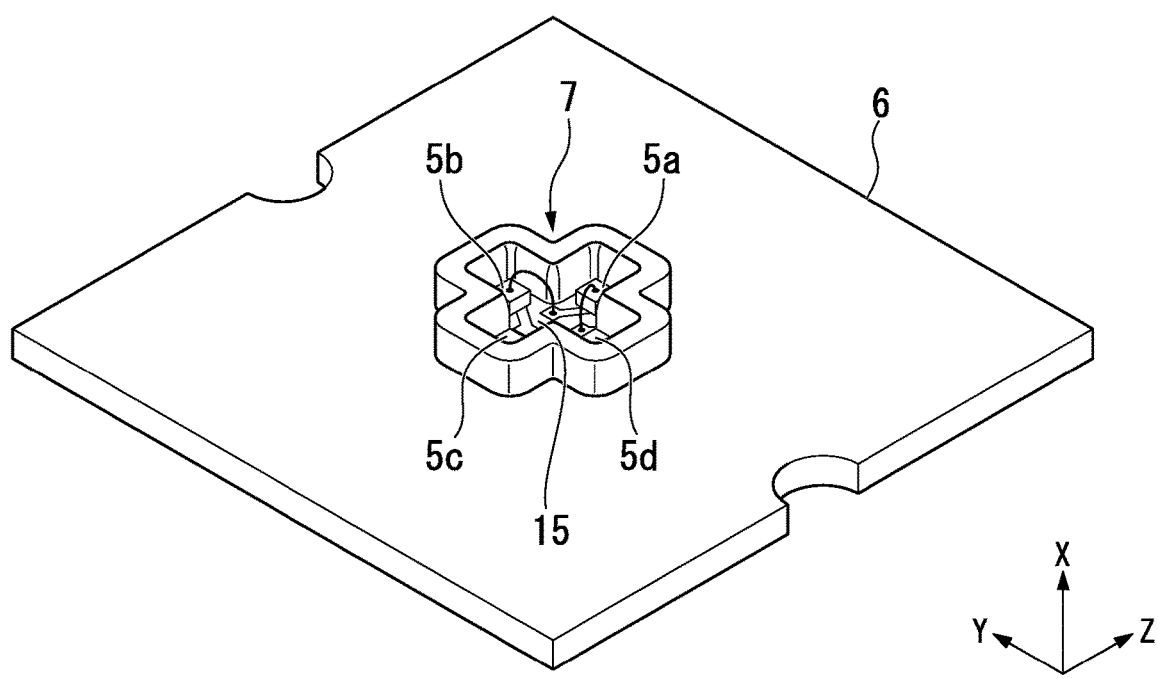
FIG. 4 is a perspective view showing a configuration of a circuit board of the light source unit for a vehicle headlight shown in FIG. 1 on a front surface side thereof.
Figure 5:
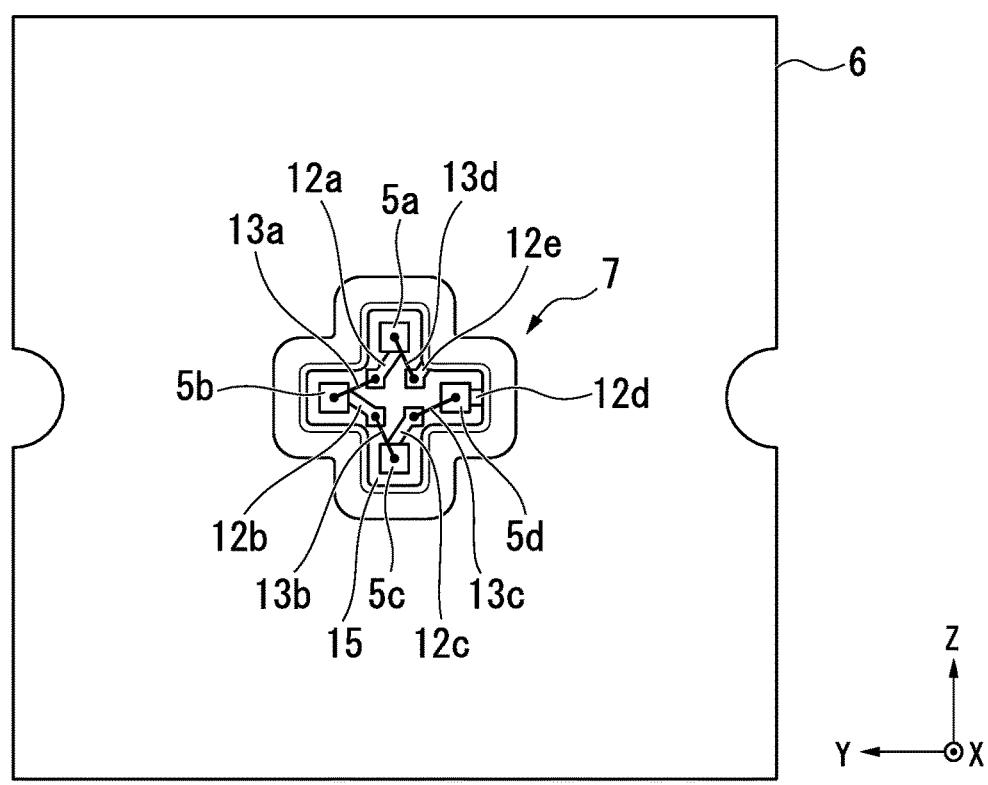
FIG. 5 is a plan view showing a configuration of the circuit board of the light source unit for a vehicle headlight shown in FIG. 1 on a front surface side thereof.
Figure 6:
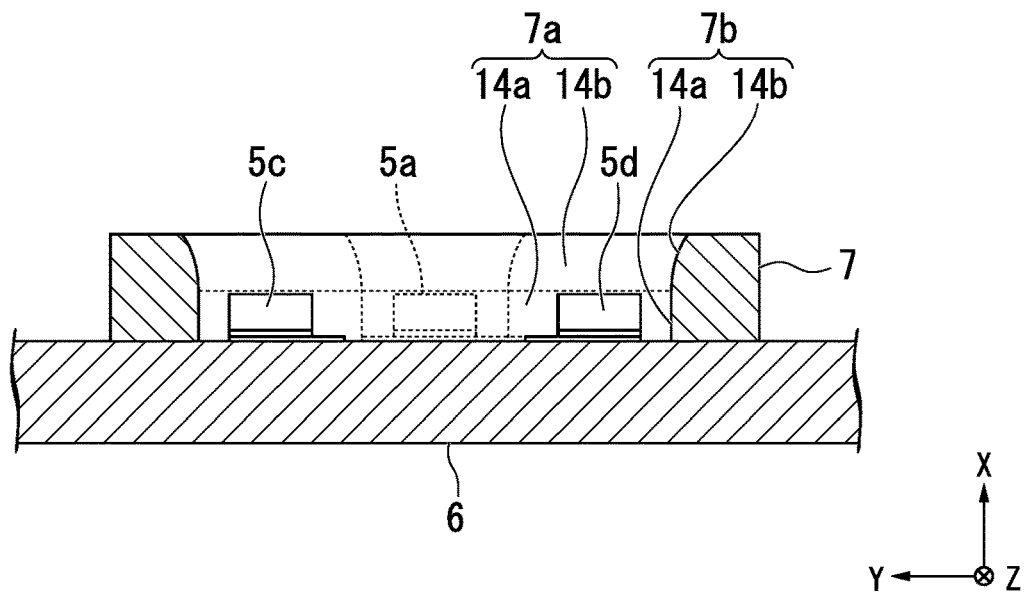
FIG. 6 is a cross-sectional view showing a configuration of the circuit board of the light source unit for a vehicle headlight shown in FIG. 1 on a front surface side thereof.
Figure 7:
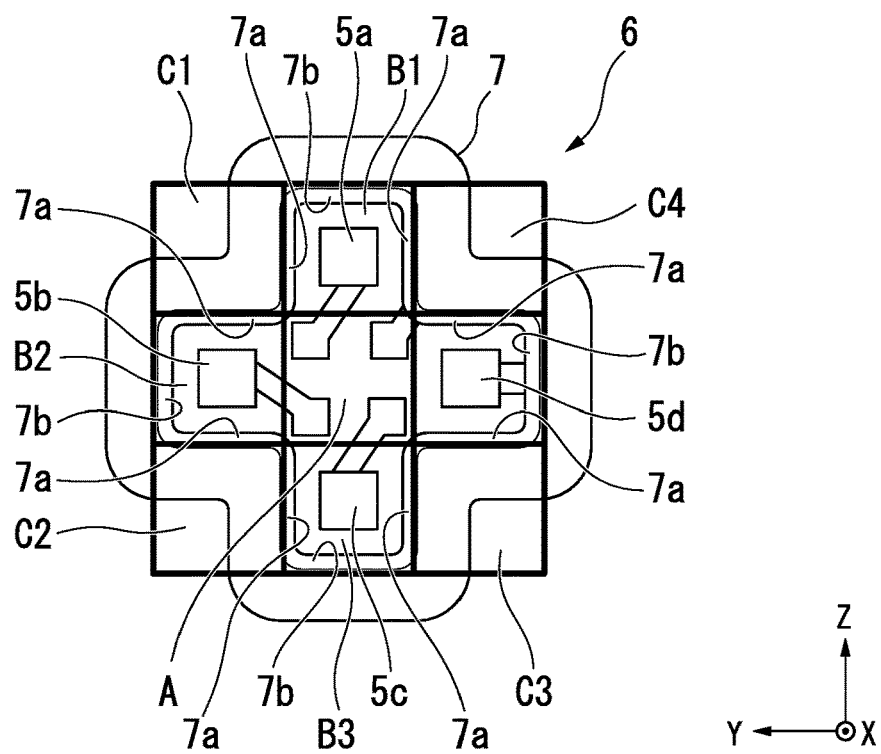
FIG. 7 is a schematic view showing nine areas defined on a surface of the circuit board of the light source unit for a vehicle headlight shown in FIG. 1.

A specific configuration of the light source unit 1 of the embodiment will be described with reference to FIG. 2 to FIG. 7. Further, FIG. 2 is a transparent perspective view showing a configuration of the light source unit 1. FIG. 3 is an exploded perspective view showing a configuration of the light source unit 1. FIG. 4 is a perspective view showing a configuration of a circuit board 6 of the light source unit 1 on a front surface side. FIG. 5 is a plan view showing a configuration of the circuit board 6 of the light source unit 1 on a front surface side. FIG. 6 is a cross-sectional view showing a configuration of the circuit board 6 of the light source unit 1 on a front surface side. FIG. 7 is a schematic view showing nine areas defined on a surface of the circuit board 6 of the light source unit 1.

As shown in FIG. 2 to FIG. 6, the light source unit 1 of the embodiment includes the circuit board 6 on which four light emitting devices 5a to 5d are disposed at each of four directions with respect to the center thereof, a reflector 7 installed on the circuit board 6 to surround the four light emitting devices 5a to 5d, a radiating section 8 configured to radiate heat emitted from the four light emitting devices 5a to 5d, and a case 10 in which a connector section 9 electrically connected to the circuit board 6 is provided.

The four light emitting devices 5a to 5d are constituted by chip LEDs (SMD LEDs) configured to emit red light (hereinafter, referred to as light). In addition, a high output type LED for vehicle lighting may be used for the chip LED. Further, in the embodiment, four light emitting devices 5a to 5d with the same output (size) are used. In the surface of the circuit board 6, the four light emitting devices 5a to 5d are disposed at positions which are radially separated in directions of upward, downward, leftward and rightward away from a center position of them (a substantially central portion of the circuit board 6) with equal distance.

The circuit board 6 is constituted by a print wiring board (PWB) having a rectangular flat plate shape, and has a configuration in which the four light emitting devices 5a to 5d and a plurality of electronic parts 11 that constitute a driving circuit configured to drive the four light emitting devices 5a to 5d are mounted on a front surface (a top surface) thereof.

Here, as schematically shown in FIG. 7, in an area of 3 mm square (3 mm×3 mm), a substantially central portion of the circuit board 6 is divided into a total of nine areas including four side areas B1 to B4 in which the four light emitting devices 5a to 5d are disposed, one center area A disposed at a center inside the four side areas B1 to B4, and four corner areas C1 to C4 disposed as corner sections adjacent to the four side areas B1 to B4. Further, the nine areas are areas of 1 mm square (1 mm×1 mm) obtained by dividing the area of 3 mm square (3 mm×3 mm) into nine sections uniformly in upward and downward, and leftward and rightward directions. In addition, the light emitting devices 5a to 5d are disposed at substantially central portions of each of the side areas B1 to B4.

A plurality of (in the embodiment, five) wirings 12a to 12e configured to linearly connect the four light emitting devices 5a to 5d to each other are provided on a front surface of the circuit board 6. That is, among the five wirings 12a to 12e, the wiring 12a has one end side electrically connected to the light emitting device 5a on an upper side, and the other end side electrically connected to the light emitting device 5b on a left side via a bonding wire 13a. The wiring 12b has one end side electrically connected to the light emitting device 5b on the left side, and the other end side electrically connected to the light emitting device 5c on a lower side via a bonding wire 13b. The wiring 12c has one end side electrically connected to the light emitting device 5c on the lower side, and the other end side electrically connected to the light emitting device 5d on a right side via a bonding wire 13c. The wiring 12d has one end side electrically connected to the light emitting device 5d on a right side, and the other end side electrically connected to a driving circuit side. The wiring 12e has one end side electrically connected to the driving circuit side, and the other end side electrically connected to the light emitting device 5a on an upper side via a bonding wire 13d.

In the circuit board 6, the other end sides of the wirings 12a, 12b and 12c disposed in the center area A and each of the light emitting devices 5b, 5c and 5d, which are disposed next to each of the light emitting devices 5a, 5b and 5c electrically connected to the one end sides of each of the wirings 12a, 12b and 12c, are respectively electrically connected to each other via the bonding wires 13a, 13b and 13c. In addition, the other end side of the wiring 12d disposed in the center area A and the light emitting device 5a are electrically connected to each other via the bonding wire 13d. Accordingly, in the circuit board 6, a configuration for which the four light emitting devices 5a to 5d are linearly connected to each other in the area including the center area A and the four side areas B1 to B4 is provided.

As shown in FIG. 2 to FIG. 6, the reflector 7 is formed of a white resin material having a high reflectance. The reflector 7 constitutes a substantially cross-shaped frame body that surrounds the area including the center area A and the four side areas B1 to B4. The reflector 7 is attached to the front surface of the circuit board 6 through adhesion or the like.

Eight first reflective surfaces 7a that divide spaces between the side areas B1 to B4 and the corner areas C1 to C4 and four second reflective surfaces 7b that divide sides of the side areas B1 to B4 opposite to the center area A are formed on an inner circumferential surface of the reflector 7.

The first reflective surfaces 7a and the second reflective surfaces 7b have a vertical surface section 14a vertically standing upward from the front surface of the circuit board 6, and an inclined surface section 14b inclined from the vertical surface section 14a toward an opening end of the reflector 7. In addition, a height of the reflector 7 is set to be higher than a maximum height position of the bonding wires 13a to 13d.

The vertical surface section 14a may have a height that substantially coincides with the light emitting devices 5a to 5d disposed on the front surface of the circuit board 6. Accordingly, unnecessary reflection of light by the first reflective surfaces 7a and the second reflective surfaces 7b can be minimized.

The inclined surface section 14b preferably has a curved surface shape (a so-called R surface) that protrudes outward. Accordingly, light emitted from the light emitting devices 5a to 5d can be efficiently diffused.

Further, while the reflector 7 of the embodiment is configured with the first reflective surfaces 7a and the second reflective surfaces 7b using reflective properties of a material of the reflector 7 itself, the embodiment is not limited to such a configuration, and for example, a configuration in which a reflective film that forms the first reflective surfaces 7a and the second reflective surfaces 7b is formed on a surface of the frame body that constitutes the reflector 7 may be provided.

A sealing resin 15 configured to seal an inner side of the reflector 7 is provided inside the reflector 7. The sealing resin 15 is formed of a transparent resin material (having optical transparency) with respect to light emitted from the light emitting devices 5a to 5d, for example, a silicon resin or the like. The sealing resin 15 protects the light emitting devices 5a to 5d the wirings 12a to 12e, and the bonding wires 13a to 13d due to the sealing resin 15 being incased inside the reflector 7.

The case 10 has a structure in which a heat sink 16 formed of a metal material having high heat conductivity and a socket 17 formed of an insulating resin material having high heat conductivity are provided, and the heat sink 16 is integrally attached to an inner side of the socket 17.

Specifically, the heat sink 16 has a front wall section 16a having a substantially circular shape, a circumferential wall section 16b having a substantially cylindrical shape and surrounding a periphery of the front wall section 16a on a back surface side, and a protrusion 16c having a substantially square shape and protruding forward from a substantially central portion with respect to the front wall section 16a on a front surface side.

Meanwhile, the socket 17 has a front wall section 17a having a substantially circular shape, a circumferential wall section 17b having a substantially cylindrical shape and surrounding a periphery of the front wall section 17a on a back surface side, a front cylindrical section 17c having a substantially cylindrical shape and protruding forward from a substantially central portion with respect to the front wall section 17a on a front surface side, and a through-hole 17d having a substantially square shape and passing through the front wall section 17a inside the front cylindrical section 17c.

The heat sink 16 is integrally attached to an inner side of the socket 17 by being fitted into the circumferential wall section 17b from a back surface side of the socket 17 in a state in which the protrusion 16c passes through the through-hole 17d.

The radiating section 8 is constituted by the heat sink 16 that constitutes at east a part of the case 10 for efficiently radiating the heat emitted from the tight emitting devices 5a to 5d to the outside. The circuit board 6 is attached to a front surface of the protrusion 16c via thermally conductive grease (not shown) while being electrically insulated from the heat sink 16.

The connector section 9 has a pair of lead terminals 18a and 18b. Each of the lead terminals 18a and 18b is provided to pass through the front wall section 16a along a lower surface of the protrusion 16c in the forward/rearward direction while being electrically insulated from the heat sink 16.

A pair of bole sections (not shown) passing through the circuit board 6 are formed in the circuit board 6. In addition, lands 19a and 19b that form the other end side of the wiring 12d and one end side of the wiring 12e are provided around the pair of hole sections. The circuit board 6 is electrically connected to the pair of lead terminals 18a and 18b by fixing the lands 19a and 19b and the lead terminals 18a and 18b around the hole sections through soldering in a state in which the pair of lead terminals 18a and 18b pass through the pair of hole sections, respectively.

In the light source unit 1 of the embodiment having the above-mentioned configuration, a percentage of the luminous flux emitted from the segments corresponding to the four corner areas C1 to C4 can be minimized by the reflector 7 that surrounds the area including the center area A and the four side areas B1 to B4. In addition, a percentage of the luminous flux emitted from each of the segments corresponding to the four side areas B1 to B4 can be increased.

Accordingly, in the light source unit 1 of the embodiment, in the total luminous flux of the light emitted forward from the four light emitting devices 5a to 5d, when a percentage of the luminous flux emitted from each of the segments corresponding to the four side areas B1 to B4 can be set to 20% or more, a percentage of the luminous flux emitted from each of the segments corresponding to the one center area A and the four corner areas C1 to C4 can be set to 10% or less, a percentage of the luminous flux as a total sum of all areas can be set to 90% or more, and the light distribution standards shown in the Table 1 can be satisfied.

In addition, in the light, source unit 1 of the embodiment, a range of luminous intensity standard of standardized products and mass-produced products can be satisfied regarding a value [cd/1000 lm] at each of the measurement points of normalized luminous intensities of LR3A and LR3B shown in the Table 2.

Further, in the light source unit 1 of the embodiment, as disclosed in detail in Japanese Unexamined Patent Application, First Publication No. 2016-195099, since high molding accuracy and mounting accuracy with respect to the lens are not required, costs can be minimized to a low level. In addition, positioning of the reflector 7 with respect to the circuit board 6 is facilitated due to a shape of the reflector 7.

Further, the present invention is not necessarily limited to this embodiment and various modifications may be made without departing from the scope of the present invention.

Figure 8A:
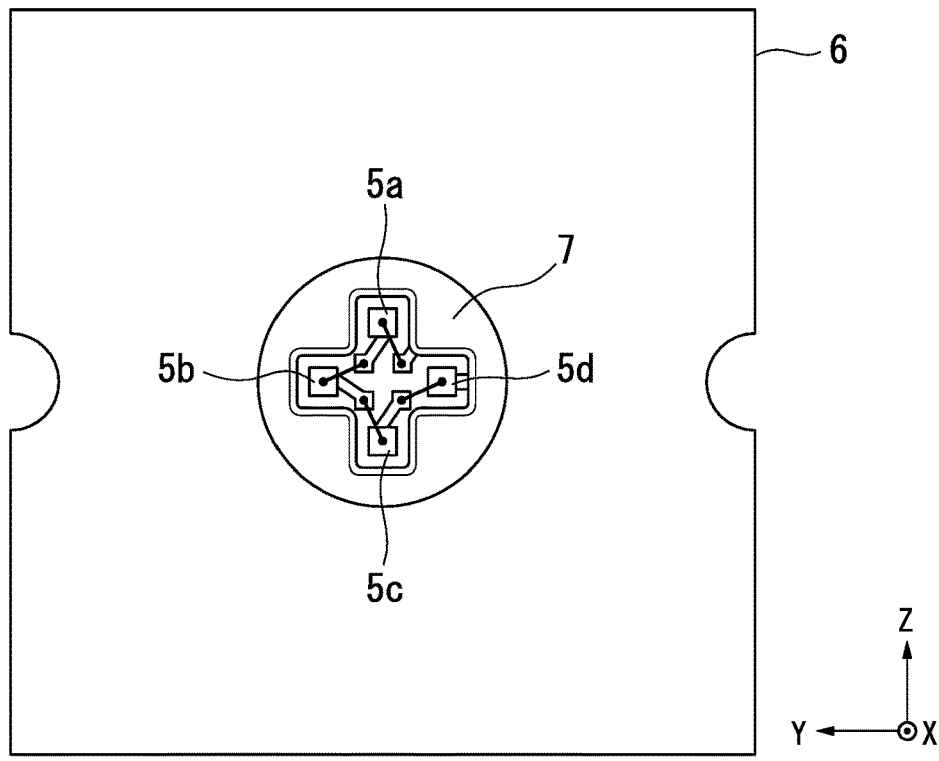
FIG. 8A is a plan view showing another configuration example of a reflector.
Figure 8B:
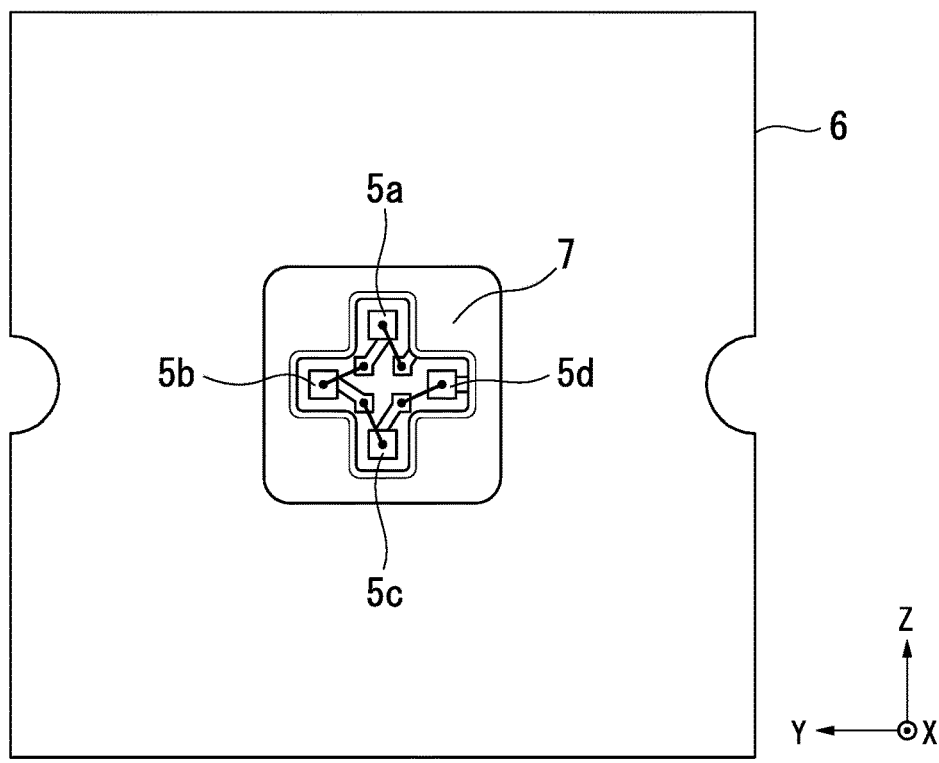
FIG. 8B is a plan view showing another configuration example of the reflector.

For example, the reflector 7 is not limited to an external shape corresponding to a cross-shaped frame body, and may have an appearance of a circular shape when seen in a plan view as shown in FIG. 8A or an appearance of a rectangular shape when seen in a plan view as shown in FIG. 8B.

Figure 9A:
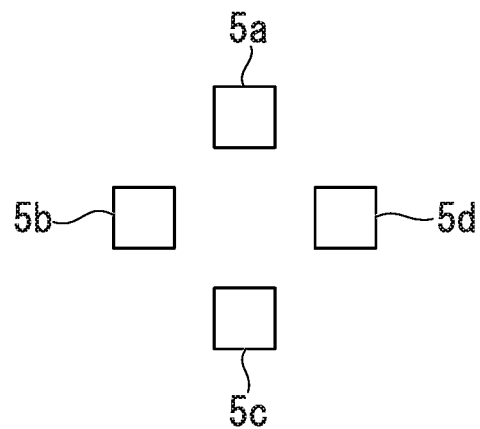
FIG. 9A is a plan view showing a disposition example of four light emitting devices.
Figure 9B:
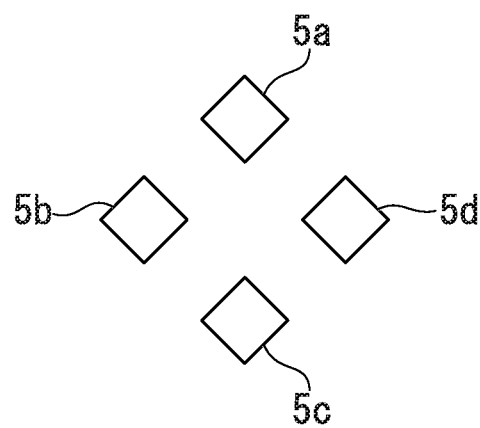
FIG. 9B is a plan view showing a disposition example of four light emitting devices.

In addition, the disposition of the light emitting devices 5a to 5d is not limited to a configuration, as shown in FIG. 9A, in which each sides of the light emitting devices 5a to 5d that form a rectangular shape (in the embodiment, a square shape) when seen in a plan view coincide with directions of upward, downward, leftward and rightward of the vehicle headlight 100 and may have a configuration in which, as shown in FIG. 9B, each corners of the light emitting devices 5a to 5d coincide with directions of upward, downward, leftward and rightward of the vehicle headlight 100. That is, the light emitting devices 5a to 5d can be rotated around optical axes thereof to change the disposition thereof.

Further, in the embodiment, while the case in which the present invention is applied to a tail lamp has been exemplified, when the tail lamp is configured, in addition to the light source unit 1, for example, other members such as an inner lens, an outer lens, a reflector, an extension, or the like, may be combined therewith.

In addition, the vehicle headlight to which the present invention is applied is not limited to the above-mentioned tail lamp, and for example, the present invention can be widely applied to a vehicle headlight such as a headlight (headlamp) for a vehicle, a width indicator (a position light), an auxiliary headlight (a sub-headlamp), a front (rear) fog light (fog lamp), a daytime running light (DRL) lamp, LED lights, a brake light (a stopping light), a rear light, a direction indicator (a turn indicator light), or the like. Further, the light source unit 1 can also be applied in other uses of the above-mentioned vehicle headlight (for example, an infrared light source for general lighting, a distance image sensor (TOF), or the like).

In addition, the light source unit to which the present invention is applied can use a light emitting device such as a laser diode (LD) or the like in addition to the above-mentioned LED. In addition, a color of light emitted from the light emitting device may be appropriately changed according to a use of the light source unit such as white light, orange light, or the like, in addition to the above-mentioned red light.

EXAMPLES

Hereinafter, an effect of the present invention will be made apparent using examples. Further, the present invention is not limited to the following examples and various modifications may be made without departing from the scope of the present invention.

Example 1

In Example 1, with respect to the light source unit using the reflector of the present invention, in a total luminous flux (80 lm) of the light emitted forward from the four light emitting devices, luminous fluxes [lm] emitted from the segments corresponding to the areas A, B1 to B4 and C1 to C4 shown in FIG. 7 and percentage [%] thereof were measured through computer simulation. Measurement results thereof are shown in the following Table 3.

TABLE 3

|  | C1 | B1 | C4 |
|---|---|---|---|
| Luminous flux | 1.45 | 13.71 | 1.45 |
| Percentage | 2.21% | 20.94% | 2.22% |
|  | B2 | A | B4 |
| Luminous flux | 13.70 | 1.39 | 13.69 |
| Percentage | 20.93% | 2.13% | 20.92% |
|  | C2 | B3 | C3 |
| Luminous flux | 1.45 | 13.70 | 1.45 |
| Percentage | 2.22% | 20.94% | 2.22% |

In addition, in the light source unit of Example 1, an extraction efficiency [%] of light emitter forward from the four light emitting devices was obtained from ratio of a sum (a total luminous flux) of the luminous fluxes [lm] emitted from the segments corresponding to each of the areas A, B1 to B4, C1 to C4 with respect to a total luminous flux (an input luminous flux) of the light through calculation. The calculation results are shown in the following Table 4.

TABLE 4

| Total luminous flux | 65.44 |
|---|---|
| Input luminous flux | 80 |
| Extraction efficiency | 81.80% |

Comparative Example 1

Figure 10:
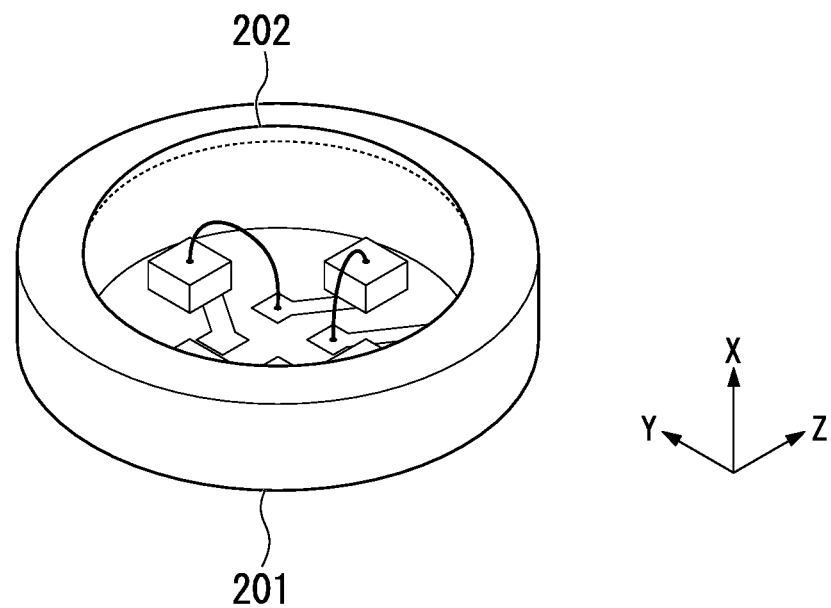
FIG. 10 is a perspective view showing a configuration of a circuit board, on which a reflector is disposed, that is Comparative Example 1, on a front surface side thereof.

In Comparative Example 1, the same light source unit as in Example 1 except for a cylindrical frame body 201 and a lens 202 disposed thereon shown in FIG. 10 was fabricated as disclosed in detail in Japanese Unexamined Patent Application, First Publication No. 2016-195099.

Then, with respect to the light source unit of Comparative Example 1, among the total luminous flux (80 lm) of the light emitted forward from the four light emitting devices, luminous fluxes [lm] emitted from the segments corresponding to each of the areas A, B1 to B4 and C1 to C4 shown in FIG. 7 and percentage [%] thereof were measured through computer simulation. Measurement results thereof are shown in the following Table 5.

TABLE 5

|  | C1 | B1 | C4 |
|---|---|---|---|
| Luminous flux | 2.06 | 10.62 | 20.6 |
| Percentage | 3.89% | 20.10% | 3.89% |
|  | B2 | A | B4 |
| Luminous flux | 10.66 | 1.77 | 10.65 |
| Percentage | 20.17% | 3.34% | 20.15% |
|  | C2 | B3 | C3 |
| Luminous flux | 2.03 | 10.63 | 2.02 |
| Percentage | 3.84% | 20.11% | 3.81% |

In addition, in the light source unit of Comparative Example 1, an extraction efficiency [%] of light emitted forward from the four light emitting devices was obtained from a ratio of a sum (a total luminous flux) of the luminous fluxes [lm] emitted from each of the segments corresponding to the areas A, B1 to B4, C1 to C4 with respect to a total luminous flux (an input luminous flux) of the light through calculation. The calculation results are shown in the following Table 6.

TABLE 6

| Total luminous flux | 52.85 |
|---|---|
| Input luminous flux | 80 |
| Extraction efficiency | 66.06% |

Comparative Example 2

Figure 11:
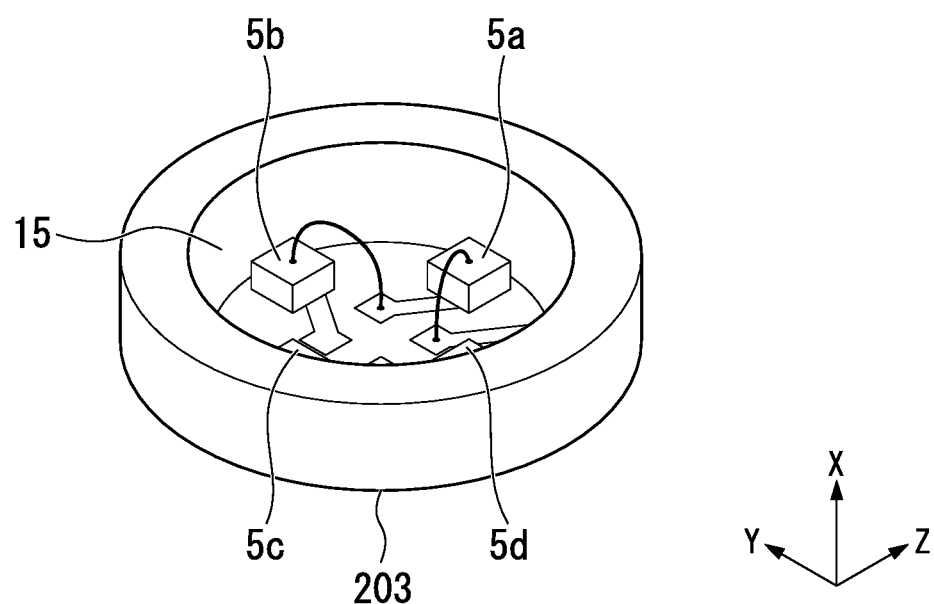
FIG. 11 is a perspective view showing a configuration of a circuit board, on which a reflector is disposed, that is Comparative Example 2, on a front surface side thereof.

In Comparative Example 2, as disclosed in detail in Japanese Patent No. 5828714, the same light source unit as in Example 1 except that a cylindrical reflector 203 shown in FIG. 11 was used was fabricated.

Then, with respect to the light source unit of Comparative Example 2, in the total luminous flux (80 lm) of the light emitted forward from the four light emitting devices, luminous fluxes [lm] emitted from each of the segments corresponding to the areas A, B1 to B4 and C1 to C4 shown in FIG. 7 and percentage [%] thereof were measured through computer simulation. Measurement results thereof are shown in the following Table 7.

TABLE 7

|  | C1 | B1 | C4 |
|---|---|---|---|
| Luminous flux | 0.43 | 9.39 | 0.42 |
| Percentage | 1.05% | 23.04% | 1.03% |
|  | B2 | A | B4 |
| Luminous flux | 9.40 | 0.73 | 9.39 |
| Percentage | 23.06% | 1.79% | 23.03% |
|  | C2 | B3 | C3 |
| Luminous flux | 0.42 | 9.40 | 0.42 |
| Percentage | 1.03% | 23.06% | 1.04% |

In addition, in the light source unit of Comparative Example 2, an extraction efficiency [%] of light emitted forward from the four light emitting devices 5a to 5d was obtained from a ratio of a sum (a total luminous flux) of the luminous fluxes [lm] emitted from the segments corresponding to each of the areas A, B1 to B4, C1 to C4 with respect to a total luminous flux (an input luminous flux) of the light through calculation. The calculation results are shown in the following Table 8.

TABLE 8

| Total luminous flux | 40.77 |
|---|---|
| Input luminous flux | 80 |
| Extraction efficiency | 50.97% |

As shown in Tables 3 to 8, it is apparent that all of the light source units of Example 1, Comparative Example 1 and Comparative Example 2 satisfied the light distribution standards shown in Tables 1 and 2, on the other hand, in comparison with the extraction efficiency of the light in Example 1, the extraction efficiency of the light in Comparative Example 1 and Comparative Example 2 is low.

Figure 12:
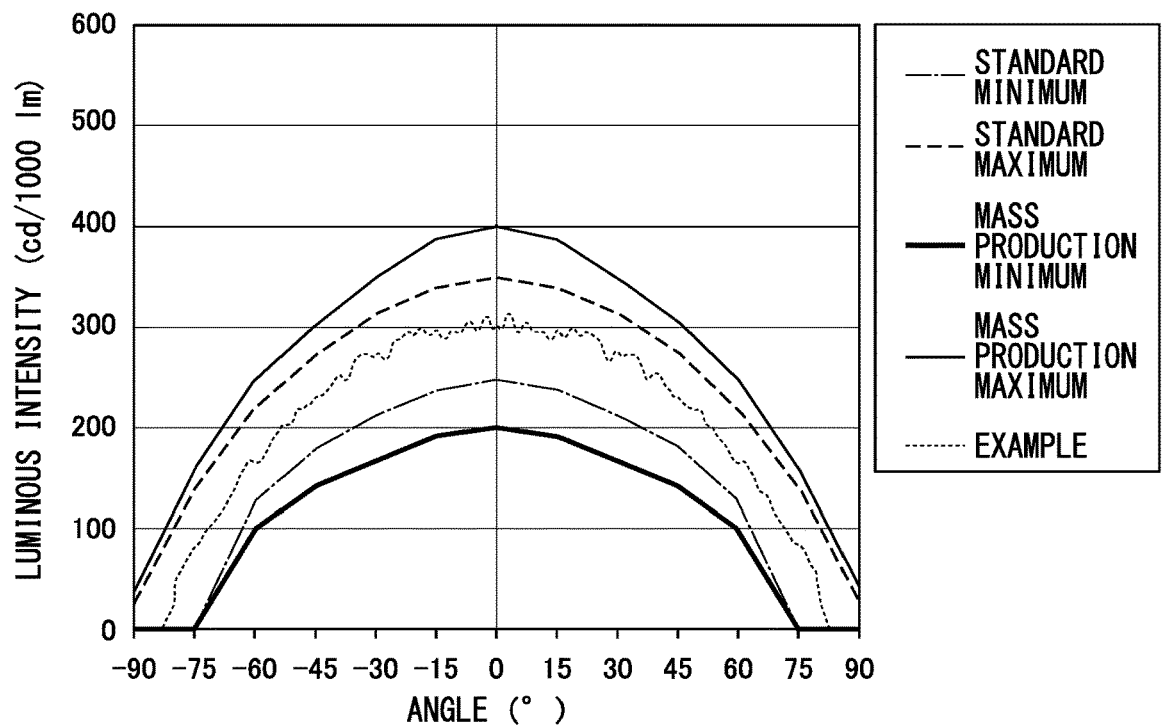
FIG. 12 is a graph showing a light distribution when a reflector of Example 1 is used.
Figure 13:
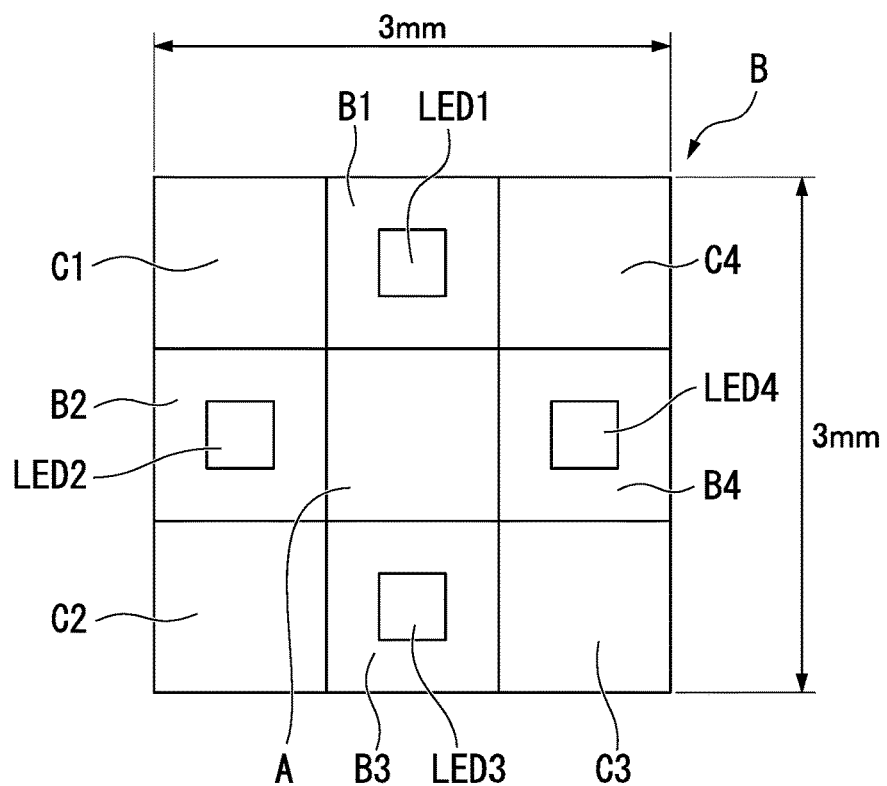
FIG. 13 is a view for explaining light distribution standards, and a schematic view showing nine areas defined on a surface of the circuit board.

In addition, a light distribution of the light source unit of Example 1 was measured. The measurement results are shown in FIG. 12. Further, the range of the luminous intensity standard of the standardized products and the mass-produced products shown in FIG. 14 is also shown in FIG. 12.

Figure 14:
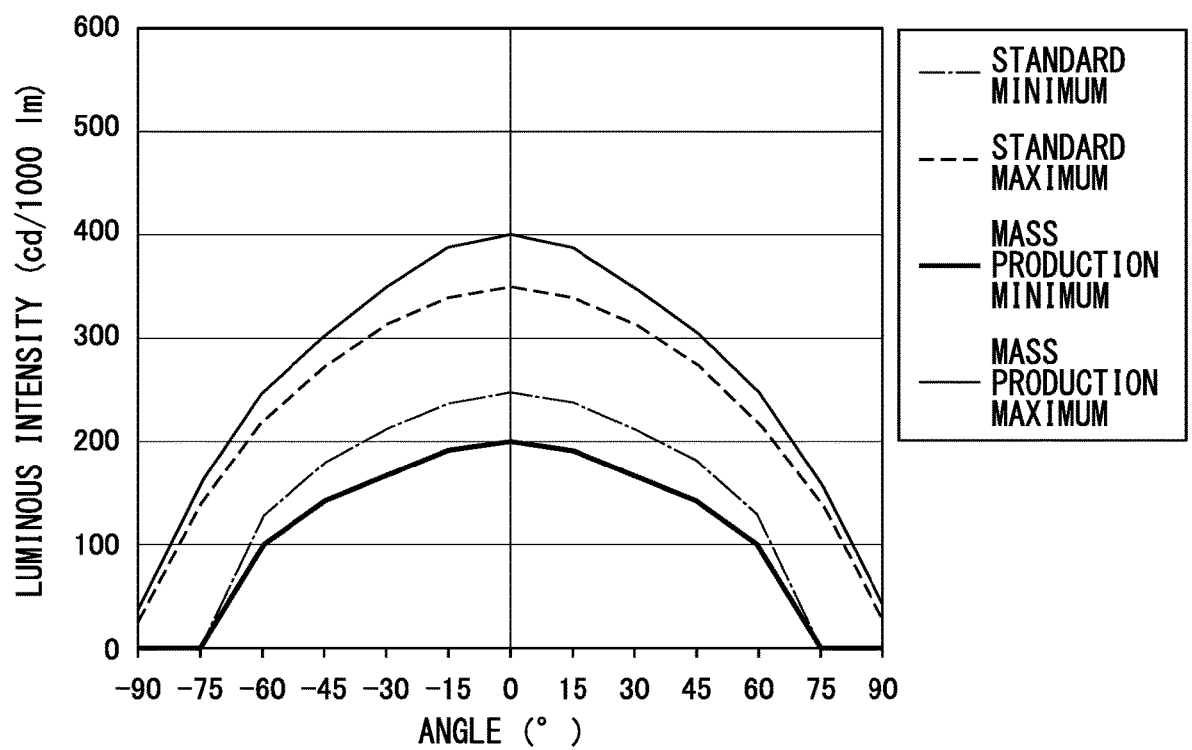
FIG. 14 is a graph showing a range of luminous intensity standards for standardized products and mass-produced products in normalized luminous intensities of LR3A and LR3B in light distribution standards.

As shown in FIG. 12, it is apparent that the light source unit of Example 1 satisfies the range of the luminous intensity standard of the standardized products and the mass-produced products shown in FIG. 14.

As described above, in the light source unit to which the present invention is applied, extraction efficiency of light can be increased while the light distribution standards shown in Tables 1 and 2 are satisfied.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A light source unit for a vehicle lamp on which an exchangeable LED lamp is mounted and which is detachably attached to an attachment hole formed in a lighting body for a vehicle, the light source unit comprising:
a circuit board which is disposed at a forward-side and on which four light emitting devices are disposed at each of four directions with respect to a center thereof; and
a case that is located rearward of the circuit board and that includes a radiating section,
wherein the case has a structure in which a heat sink formed of a metal material and a socket formed of an insulating resin material are provided, and the heat sink is integrally attached to an inner side of the socket,
the socket has a front wall section located rearward of the circuit board, a circumferential wall section having a substantially cylindrical shape and surrounding a periphery of the front wall section on a back surface side, a front cylindrical section having a substantially cylindrical shape and protruding forward from a front surface side of the front wall section, and a through-hole passing through the front wall section inside the front cylindrical section,
the heat sink has a protrusion that is located rearward of the front wall section of the socket and that protrudes forward from a front surface side of a front wall section of the heat sink,
the protrusion of the heat sink is integrally attached to an inner side of the socket in a state in which the protrusion passes through the through-hole,
the circuit board is attached to a front surface of the protrusion in a state in which the circuit board is electrically insulated,
a reflector installed on the circuit board so as to surround the four light emitting devices is provided on a forward-side surface of the circuit board,
regions where the four light emitting devices are mounted on the circuit board includes (i) four side areas in which the four light emitting devices are disposed, (ii) one center area disposed at a center of the four side areas, and (iii) four corner areas disposed at corner sections next to the four side areas, the four side areas being leftward and rightward side areas and upward and downward areas with respect to the center area, and
the reflector includes eight first reflective surfaces provided to divide spaces between each of the side areas and the corner areas, and four second reflective surfaces which are provided at boundaries opposite to the center area of each of the side areas.

2. The light source unit for a vehicle lamp according to claim 1,
wherein the first reflective surface comprises a vertical surface section vertically standing upward from a front surface of the circuit board, and an inclined surface section inclined from the vertical surface section toward an opening end of the reflector.

3. The light source unit for a vehicle lamp according to claim 1,
wherein the second reflective surface comprises a vertical surface section vertically standing upward from a front surface of the circuit board, and an inclined surface section inclined from the vertical surface section toward an opening end of the reflector.

4. The light source unit for a vehicle lamp according to claim 2,
wherein the vertical surface section has a height that substantially coincides with the light emitting device.

5. The light source unit for a vehicle lamp according to claim 2,
wherein the inclined surface section has a curved surface shape protruding outward.

6. The light source unit for a vehicle lamp according to claim 1,
wherein the circuit board comprises a plurality of wirings configured to linearly connect the four light emitting devices to each other, and among the plurality of wirings, one end side of each of the wirings that is disposed in the center area and each of the light emitting devices that are disposed next to each of the light emitting devices, which are electrically connected to other end sides of each of the wirings, are electrically connected via bonding wires, respectively.

7. The light source unit for a vehicle lamp according to claim 1,
wherein a sealing resin is provided inside the reflector.

8. The light source unit for a vehicle lamp according to claim 1,
wherein, among a total luminous flux of light emitted forward from the four light emitting devices, a percentage of a luminous flux emitted from each of segments corresponding to the four side areas is respectively 20% or more, and a percentage of a luminous flux emitted from each of segments corresponding to the one center area and the four corner areas is respectively 10% or less.

9. A vehicle headlight includes the light source unit for a vehicle lamp according to claim 1.

10. The vehicle headlight according to claim 9,
wherein the light source unit for a vehicle lamp is detachably attached to a lighting body.

11. The vehicle headlight according to claim 9, wherein the vehicle headlight is a tail lamp of the vehicle.

12. The vehicle headlight according to claim 11, wherein the four light emitting devices of the vehicle lamp are constituted by LEDs configured to emit red light.

* * * * *